(12) United States Patent
Chiang et al.

(10) Patent No.: US 10,879,170 B2
(45) Date of Patent: Dec. 29, 2020

(54) SEMICONDUCTOR PACKAGE AND MANUFACTURING METHOD THEREOF

(71) Applicant: Taiwan Semiconductor Manufacturing Co., Ltd., Hsinchu (TW)

(72) Inventors: Yung-Ping Chiang, Hsinchu County (TW); Chung-Shi Liu, Hsinchu (TW); Han-Ping Pu, Taichung (TW); Ming-Kai Liu, Hsinchu (TW); Ting-Chu Ko, Hsinchu (TW); Chang-Wen Huang, Hsinchu (TW); Yu-Sheng Hsieh, New Taipei (TW); Ching-Yu Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/389,992

(22) Filed: Apr. 21, 2019

(65) Prior Publication Data
US 2020/0335439 A1 Oct. 22, 2020

(51) Int. Cl.
| H01L 23/522 | (2006.01) |
| H01L 23/00 | (2006.01) |
| H01L 49/02 | (2006.01) |
| H01L 21/768 | (2006.01) |
| H01L 21/027 | (2006.01) |

(Continued)

(52) U.S. Cl.
CPC ...... *H01L 23/5227* (2013.01); *H01L 21/0273* (2013.01); *H01L 21/02118* (2013.01); *H01L 21/565* (2013.01); *H01L 21/76816* (2013.01); *H01L 21/76871* (2013.01); *H01L 21/76877* (2013.01); *H01L 21/76897* (2013.01); *H01L 23/5226* (2013.01); *H01L 24/08* (2013.01); *H01L 28/10* (2013.01); *H01L 2224/02372* (2013.01)

(58) Field of Classification Search
CPC ................ H01L 23/5227; H01L 21/76816
See application file for complete search history.

(56) References Cited

U.S. PATENT DOCUMENTS

| 9,000,584 B2 | 4/2015 | Lin et al. |
| 9,048,222 B2 | 6/2015 | Hung et al. |
| 9,048,233 B2 | 6/2015 | Wu et al. |

(Continued)

*Primary Examiner* — Farun Lu
(74) *Attorney, Agent, or Firm* — JCIPRNET

(57) ABSTRACT

A semiconductor package and a manufacturing method thereof are provided. The semiconductor package includes a semiconductor die, a molding compound, a polymer layer, a conductive trace, a conductive via and an inductor. The semiconductor die is laterally surrounded by the molding compound. The polymer layer covers the semiconductor die and the molding compound. The conductive trace, the conductive via and the inductor are embedded in the polymer layer. The conductive via extends from a top surface of the conductive trace to a top surface of the polymer layer. The inductor has a body portion extending horizontally and a protruding portion protruded from the body portion. A total height of the body and protruding portions is substantially equal to a sum of a thickness of the conductive trace and a height of the conductive via. The height of the body portion is greater than the thickness of the conductive trace.

20 Claims, 17 Drawing Sheets

(51) Int. Cl.
    *H01L 21/02*     (2006.01)
    *H01L 21/56*     (2006.01)

(56) References Cited

U.S. PATENT DOCUMENTS

| | | |
|---|---|---|
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2011/0074536 A1* | 3/2011 | Coffy ............... H01L 23/552 |
| | | 336/200 |
| 2019/0139897 A1* | 5/2019 | Liang ............... H01L 23/3114 |

\* cited by examiner

SEMICONDUCTOR PACKAGE AND MANUFACTURING METHOD THEREOF

BACKGROUND

As bandwidth requirement for semiconductor dies in a semiconductor package grows, the redistribution layer (RDL) formed in the semiconductor package is required to have a higher routing density. In other words, dimensions (e.g., thickness, width and/or spacing) of interconnections and inductors in the redistribution layer are shrunk. As a consequence, a quality factor of the inductors may be compromised as dimensions of the inductors are reduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
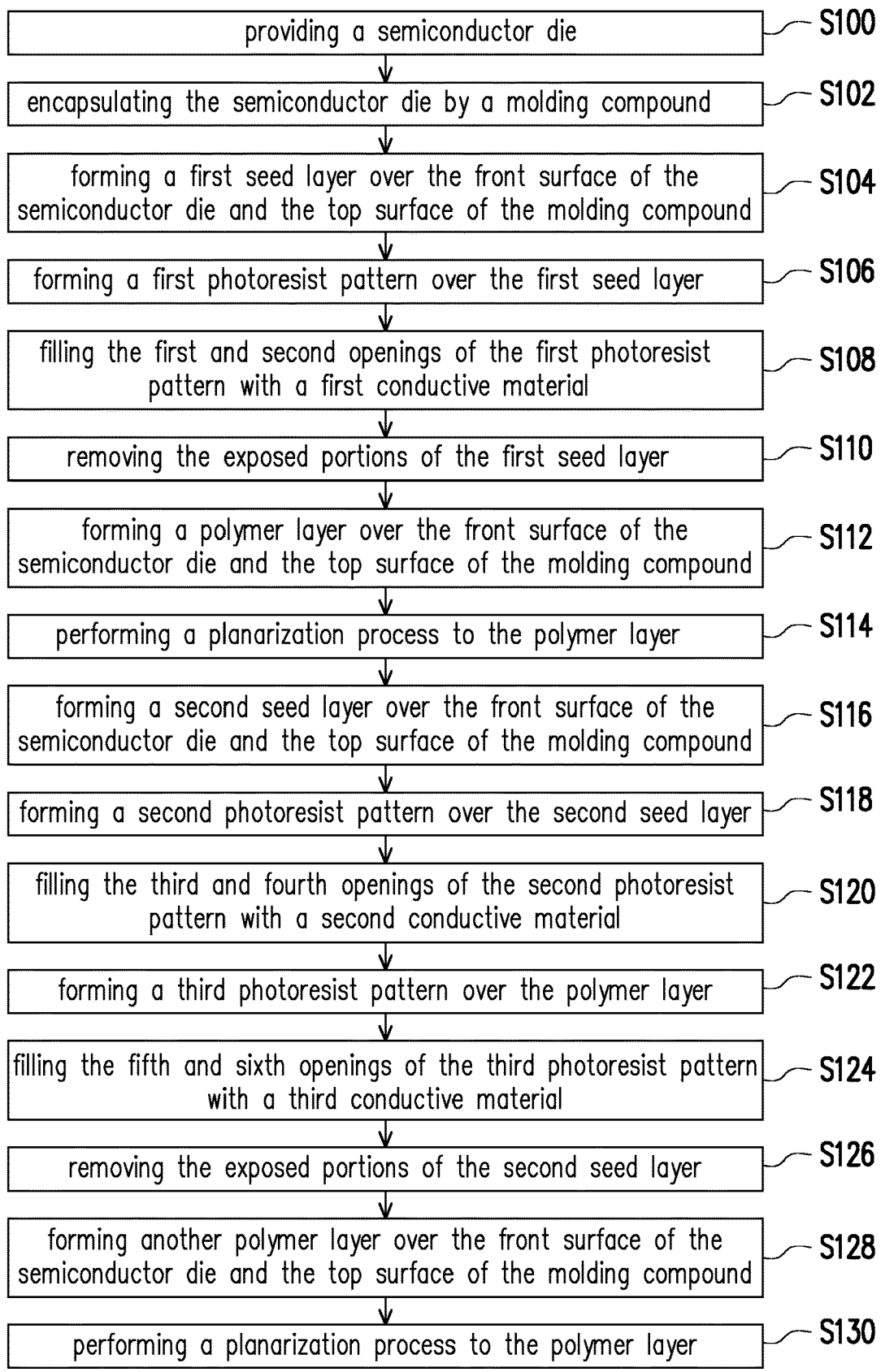
FIG. 1 is a process flow diagram illustrating a manufacturing method of a semiconductor package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that can be embodied in a wide variety of specific contexts. The embodiments are intended to provide further explanations but are not used to limit the scope of the present disclosure.

Embodiments will be described with respect to a specific context, namely a redistribution layer (RDL) in a semiconductor package. However, to other circuits and layouts is desired. Throughout the various views and illustrative embodiments, like reference numbers are used to designate like elements.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 2A:
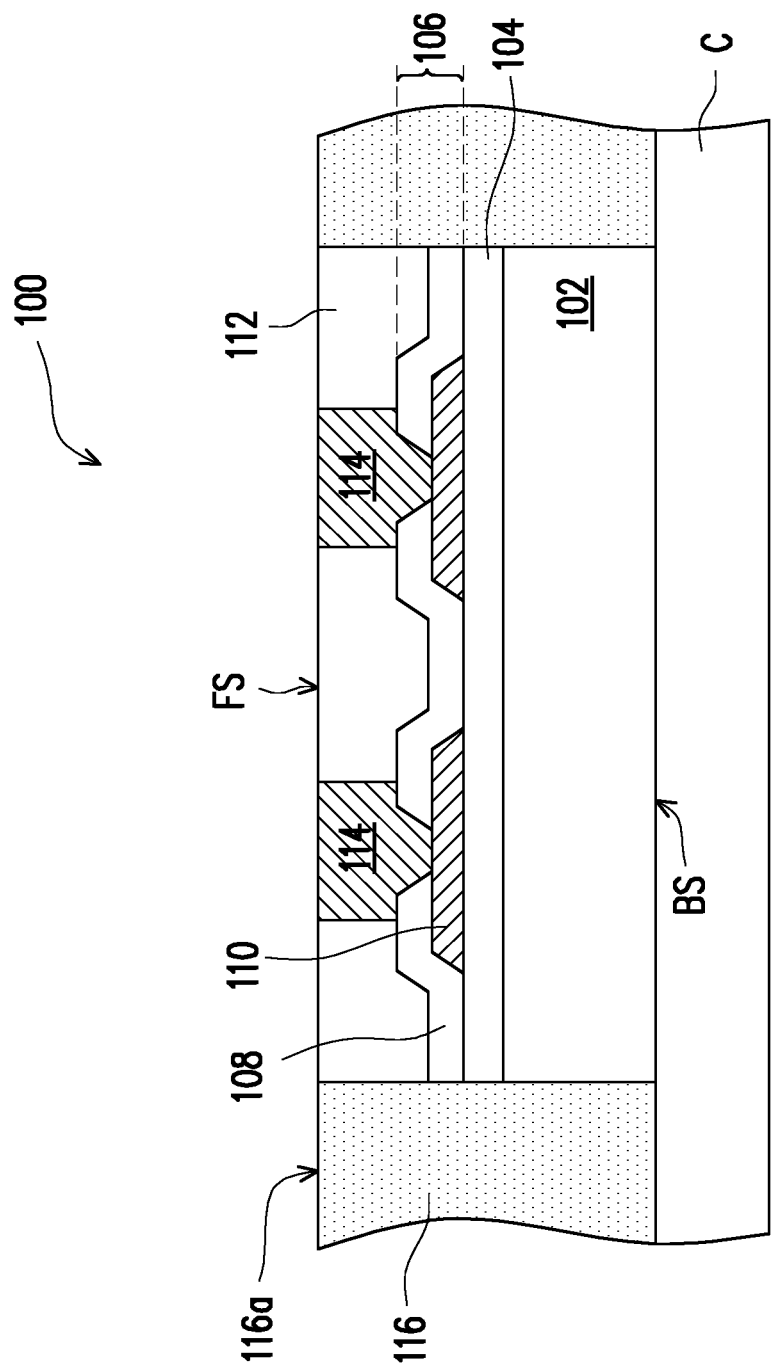
FIG. 2A through FIG. 2N are schematic cross-sectional and exemplary top views illustrating structures at various stages of the manufacturing method of a semiconductor package according to some embodiments of the present disclosure.

FIG. 1 is a process flow diagram illustrating a manufacturing method of a semiconductor package according to some embodiments of the present disclosure. FIG. 2A through FIG. 2N are schematic cross-sectional views and exemplary top views illustrating structures at various stages of the manufacturing method of a semiconductor package according to some embodiments of the present disclosure.

Referring to FIG. 1 and FIG. 2A, step S100 is performed, and a semiconductor die 100 is provided on a carrier C. In some embodiments, the semiconductor die 100 may be a logic integrated circuit (IC) die, a memory IC die, an analog IC die, an application-specific IC (ASIC) die, or the like. In some embodiments, the semiconductor die 100 includes a substrate 102. The substrate 102 may be a semiconductor substrate or a semiconductor-on-insulator (SOI) substrate. A device layer 104 is formed over the substrate 102. For example, active device(s) and passive device(s) (both not shown) may be formed in the substrate 102 and the overlying device layer 104. An interconnection layer 106 may be formed on the device layer 104. The interconnection layer 106 may include a dielectric layer 108 and interconnection structures 110 formed in the dielectric layer 108. Although the interconnection layer 106 is depicted as having a single dielectric layer 108 in FIG. 2A, the interconnection layer 106 may actually include a stack of dielectric layers. In addition, the interconnection structures 110 may include conductive trace(s) and conductive via(s) formed in the stack of dielectric layers. Further, a passivation layer 112 and conductive pillars 114 are formed over the interconnection layer 106. The conductive pillars 114 penetrate through the passivation layer 114, and extend into the dielectric layer 108 to electrically connect with the interconnection structures 110. Although one semiconductor die 100 with two conductive pillars 114 is depicted in FIG. 2A, the amount of the semiconductor die(s) may be two or more and/or the amount of the conductive pillars 114 may be more than two. Those skilled in the art may adjust the amount of the semiconductor die 100 or the conductive pillars 114 according to product requirements, and the present disclosure is not limited thereto.

Step S102 is performed, and the semiconductor die 100 is encapsulated by a molding compound 116. In other words, the semiconductor die 100 is laterally surrounded by the molding compound 116. In some embodiments, a back surface BS of the semiconductor die 100 may be attached with a carrier C through a die attach film (not shown) before encapsulating the semiconductor die 100. As such, a front surface FS (i.e., an active surface) of the semiconductor die 100 faces away from the carrier C. In some embodiments, the conductive pillars 114 of the semiconductor die 100 may be initially covered by the molding compound 116. Afterward, a planarization process may be performed on the molding compound 116, so as to expose the conductive pillars 114 and the front surface FS of the semiconductor die 100, as shown in FIG. 2A. In some embodiments, a top surface 116a of the molding compound 116 is substantially coplanar with the front surface FS of the semiconductor die 100. In some embodiments, more than one semiconductor dies 100 are laterally wrapped by the molding compound 116 and a reconstructed wafer structure is formed.

Figure 2B:
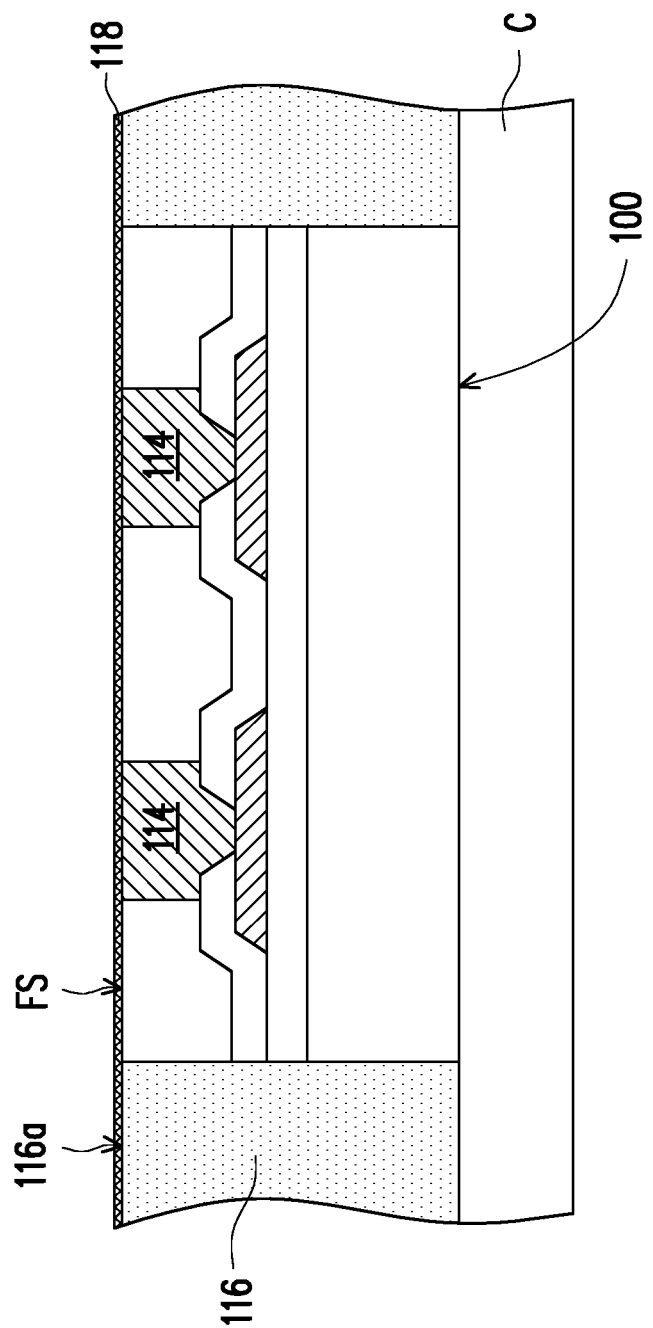

Referring to FIG. 1 and FIG. 2B, step S104 is performed, and a first seed layer 118 is formed over the front surface FS of the semiconductor die 100 and the top surface 116a of the molding compound 116. The first seed layer 118 may globally cover the whole top surface of the reconstructed wafer structure shown in FIG. 2A. In some embodiments, the first seed layer 118 is formed by a physical vapor deposition (PVD) process, such as a sputtering process. A material of the first seed layer 118 may include Ti, Cu, the like, or combinations thereof. In addition, a thickness of the first seed layer 118 may range from 200 Å to 5000 Å.

Figure 2C:
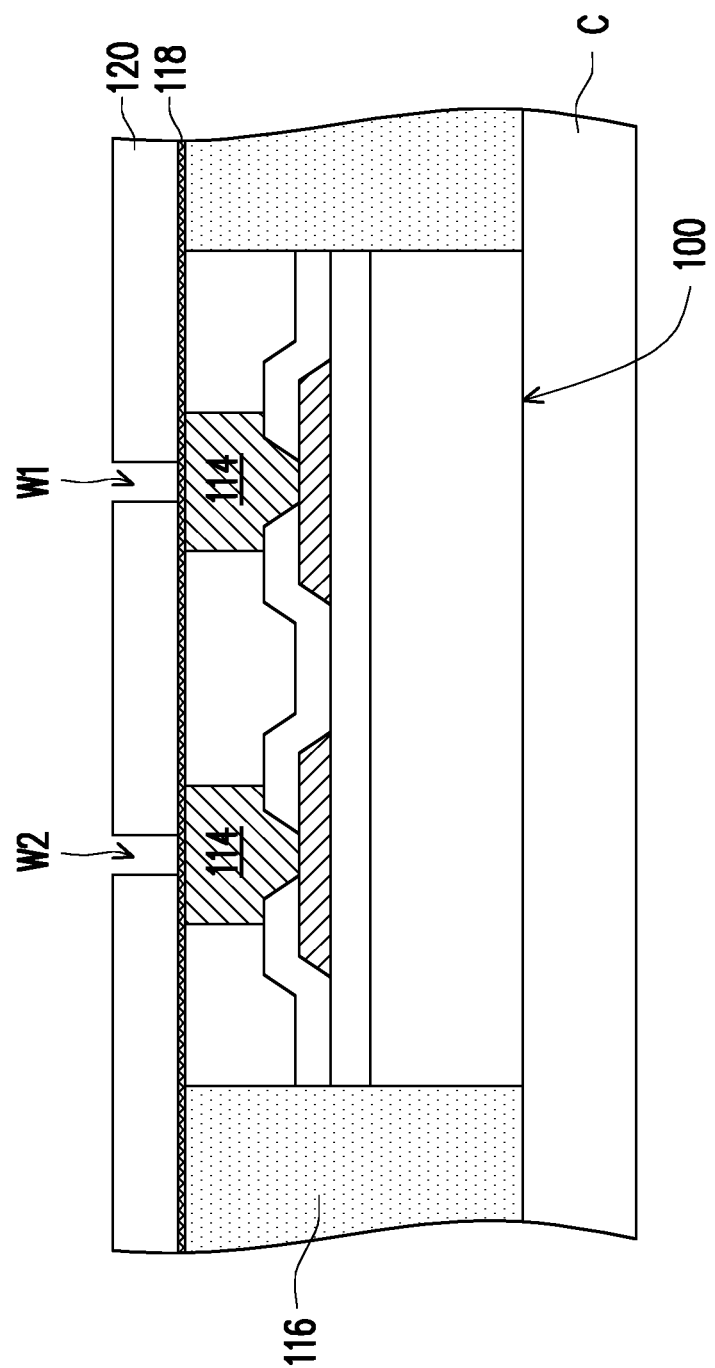
Figure 2D:
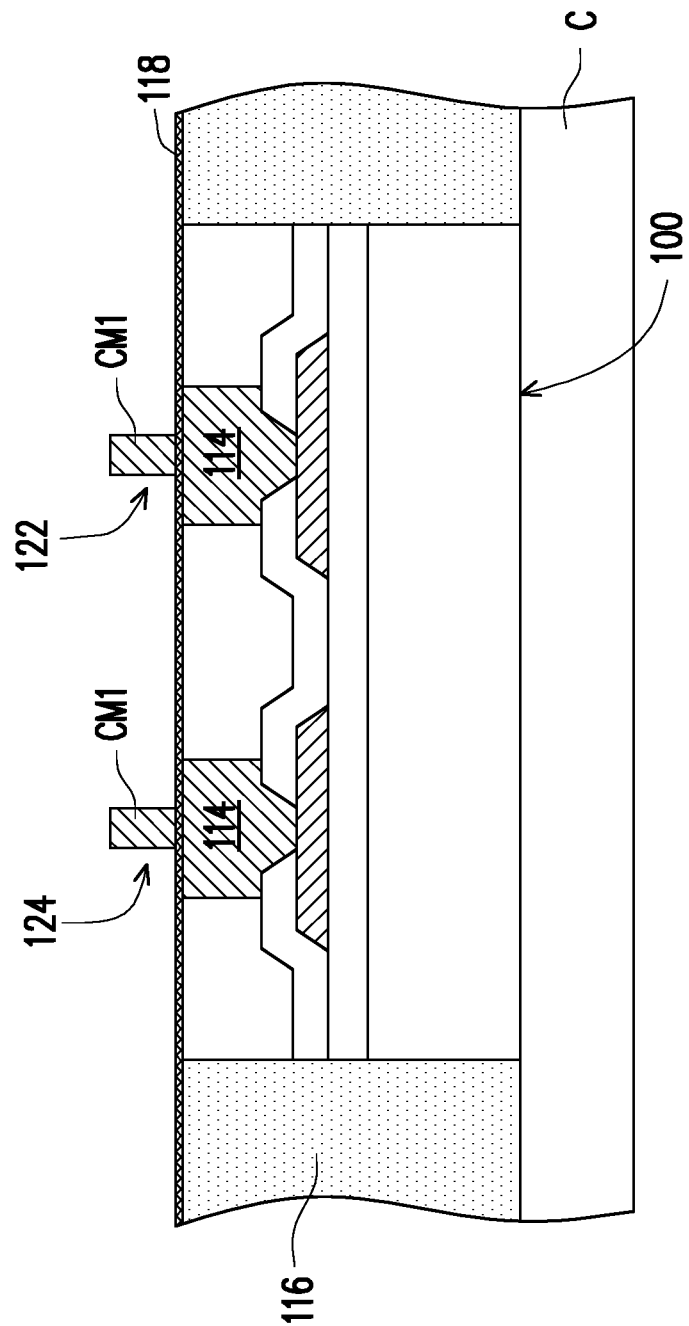

Referring to FIG. 1 and FIG. 2C, step S106 is performed, and a first photoresist pattern 120 is formed over the first seed layer 118. The first photoresist pattern 120 has at least one first opening W1 and at least one second opening W2 respectively exposing portions of the first seed layer 118. The first opening W1 and the second opening W2 respectively define locations and shapes of the conductive plug 122 and the inductor plug 124 formed in the following steps (as shown in FIG. 2D). For example, an aperture of the first opening W1 and an aperture of the second opening W2 may respectively range from 2 μm to 60 μm. Although the first photoresist pattern 120 is depicted as having two openings, those skilled in the art may form three or more openings in the first photoresist pattern 120 according to the required amount of contact plugs, the present disclosure is not limited thereto. The first photoresist pattern 120 may be formed by coating or lamination and then patterned through a lithography process including exposure and development.

Referring to FIG. 1, FIG. 2C and FIG. 2D, step S108 is performed, and the first and second openings W1 and W2 are filled with a first conductive material CM1. In some embodiments, the first and second openings W1 and W2 are substantially filled up by the first conductive material CM1. A portion of the first conductive material CM1 located in the first opening W1 as well as an underlying portion of the first seed layer 118 are collectively referred as a conductive plug 122, whereas a portion of the first conductive material CM1 located in the second opening W2 as well as an underlying portion of the first seed layer 118 are collectively referred as an inductor plug 124. The conductive plug 122 and the inductor plug 124 are respectively electrically connected with the conductive pillars 114. Dimensions (e.g., diameter) of the conductive plug 122 and the inductor plug 124 are determined by the dimensions (e.g., aperture) of the first and second openings W1 and W2 of the first photoresist pattern 120, and the dimensions (e.g., aperture) of the first and second openings W1 and W2 of the first photoresist pattern 120 are defined by a lithography process. In other words, an etching process may not be required for forming the conductive plug 122 and the inductor plug 124. As a merit of great resolution capability of the lithography process, the conductive plug 122 and the inductor plug 124 can have a rather small dimension (e.g., a rather small diameter). In some embodiments, the first conductive material CM1 may be formed by a plating process or a deposition process. The first conductive material CM1 used for forming the conductive plug 122 and the inductor plug 124 may include W, Cu, Ti, Ta, TaN, the like or combinations thereof.

Referring to FIG. 2C and FIG. 2D, after forming the conductive plug 122 and the inductor plug 124, the first photoresist pattern 120 is removed and the underlying seed layer 118 is exposed. For example, the first photoresist pattern 120 may be removed by an ashing process or a stripping process.

Figure 2E:
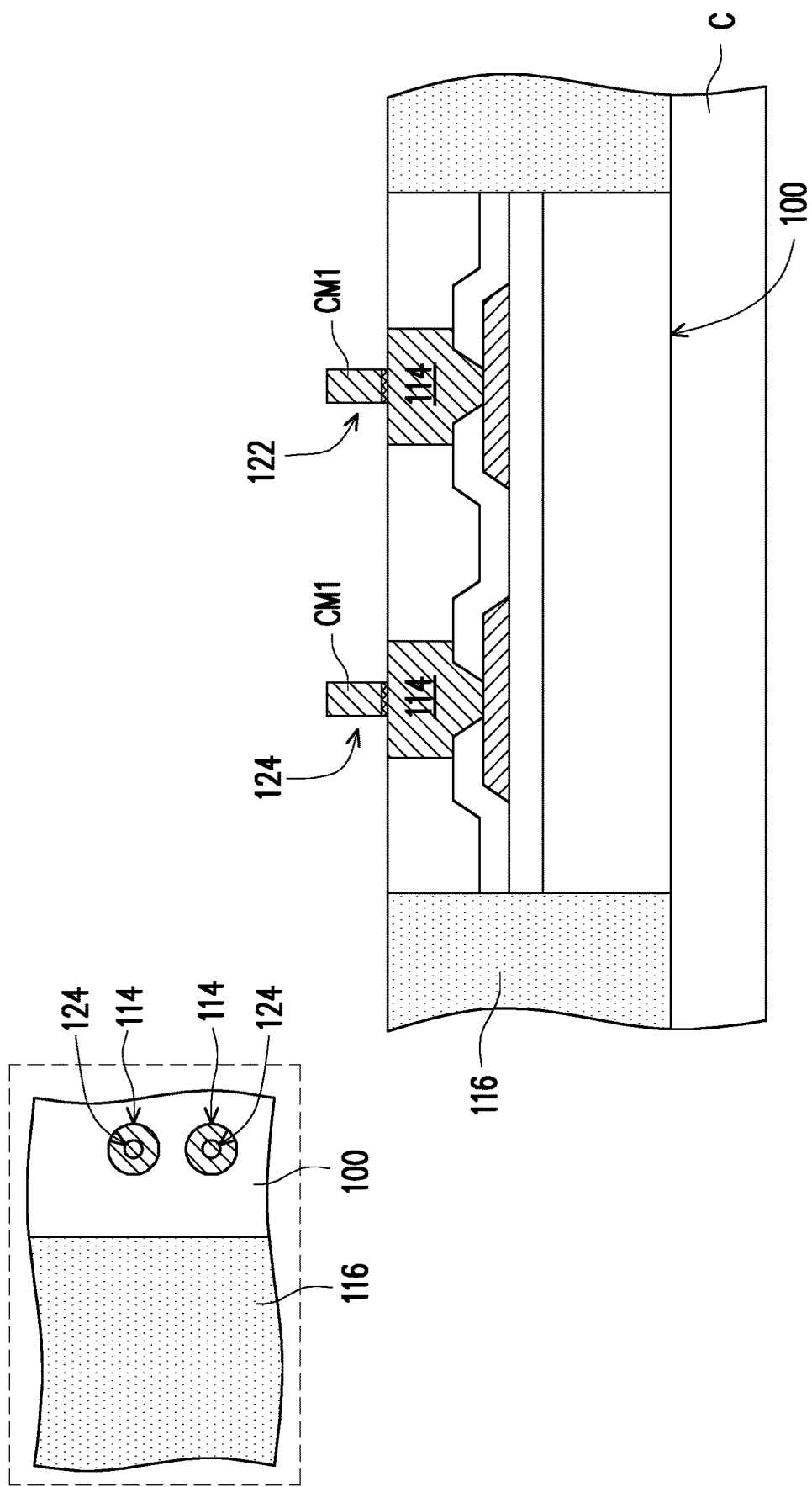

Referring to FIG. 1, FIG. 2D and FIG. 2E, step S110 is performed, and the exposed portions of the first seed layer 118 are removed. As such, portions of the first seed layer 118 lying under the first conductive material CM1 (the conductive plug 122 and the inductor plug 124) are remained, while other portions of the first seed layer 118 are removed. The exposed portions of the first seed layer 118 may be removed by an etching process, such as an anisotropic etching process or an isotropic etching process. In alternative embodiments, the seed layer 118 under the first photoresist pattern 120 may be removed together with the removal of the first photoresist pattern 120. The area enclosed by a dash line in FIG. 2E shows an exemplary top view illustrating two of the inductor plugs 124 and the underlying conductive pillars 114. In some embodiments, the top view shapes of the inductor plug 124 and the conductive pillar 114 may be substantially circular, and a cross-sectional area (top view area) of the inductor plug 124 is smaller than a top view area of the underlying conductive pillar 114. However, the top view shapes of the inductor plug 124 and the conductive pillars 114 of the present disclosure may be hexagonal, octagonal or polygonal shapes but are not limited to the embodiments disclosed herein.

Figure 2F:
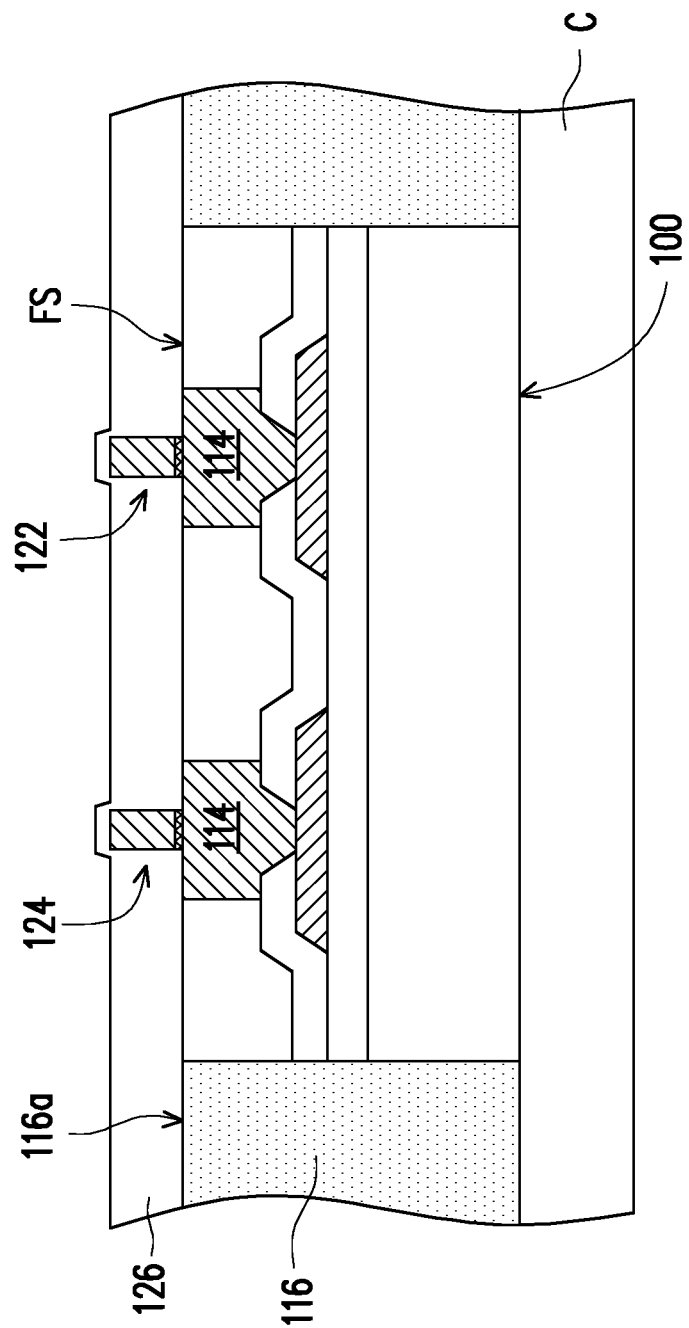

Referring to FIG. 2F, step S112 is performed, and a polymer layer 126 is formed over the front surface FS of the semiconductor die 100 and the top surface 116a of the molding compound 116. Substantially the whole top surface of the wafer structure shown in FIG. 2E is conformally covered by the polymer layer 126. As such, the conductive plug 122 and the inductor plug 124 are covered by the polymer layer 126, and can be regarded as being located in the polymer layer 126. A material of the polymer layer 126 may include polyimide, polybenzoxazole, benzocyclobuten, silicones, acrylates, epoxy or combinations thereof. In addition, the polymer layer 126 may be formed by a solution process, such as a spin coating process.

Figure 2G:
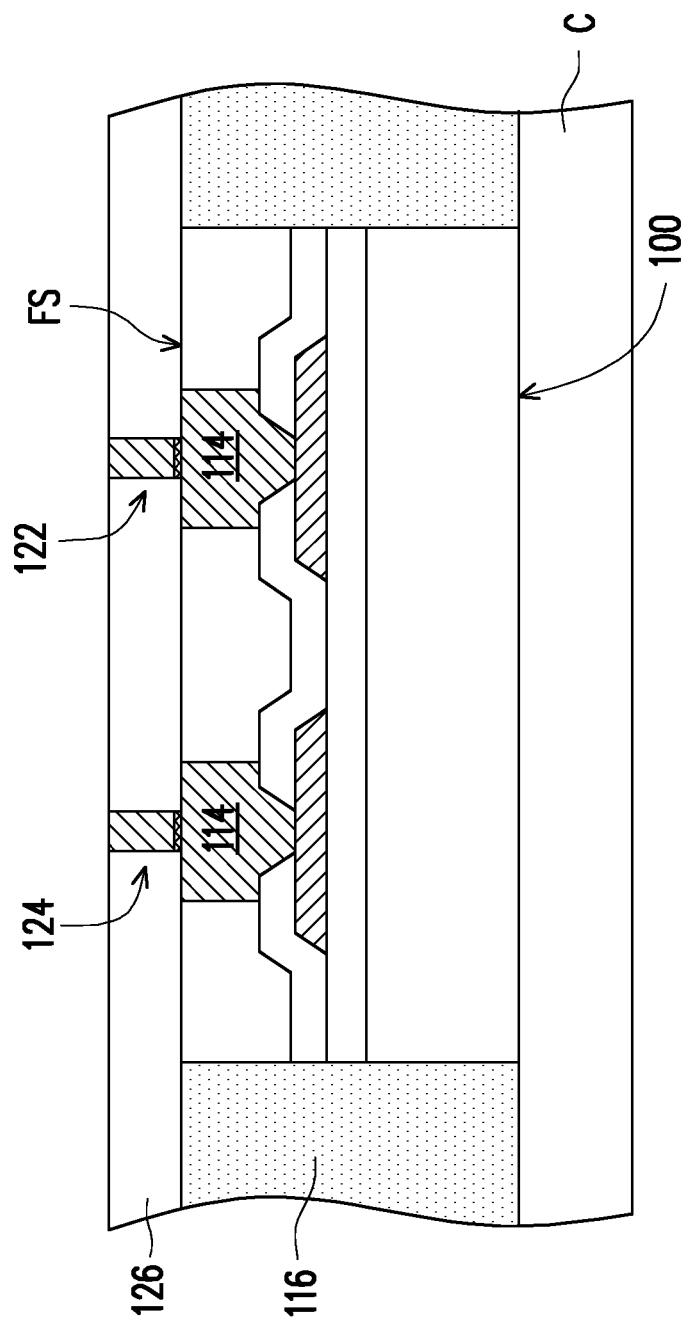

Referring to FIG. 2G, step S114 is performed, and a planarization process is performed to the polymer layer 126. As such, top surfaces of the conductive plug 122 and the inductor plug 124 are exposed. In some embodiments, the top surfaces of the conductive plug 122 and the inductor plug 124 are coplanar with a top surface of the planarized polymer layer 126. In addition, the conductive plug 122 and the inductor plug 124 can be regarded as respectively penetrating through the polymer layer 126. In some embodiments, the planarization process may include a chemical mechanical polishing (CMP) process, a grinding process or an etching back process.

Figure 2H:
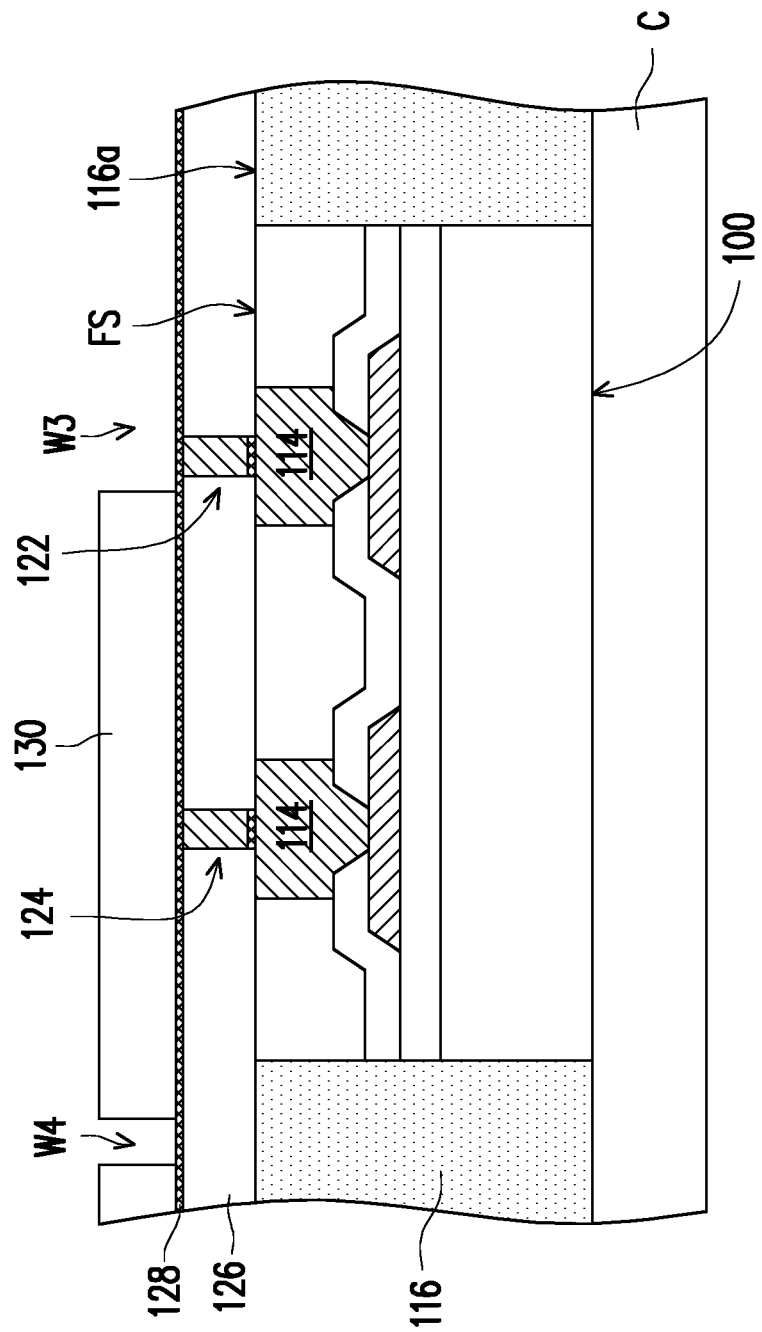

Referring to FIG. 2H, step S116 is performed, and a second seed layer 128 is formed over the front surface FS of the semiconductor die 100 and the top surface 116a of the molding compound 116. The second seed layer 128 may globally covers substantially the whole top surface of the polymer layer 126. In some embodiments, the second seed layer 128 is formed by a PVD process, such as a sputtering process. A material of the second seed layer 128 may include Ti, Cu, the like, or combinations thereof. In addition, a thickness of the second seed layer 128 may range from 200 Å to 5000 Å.

Figure 2I:
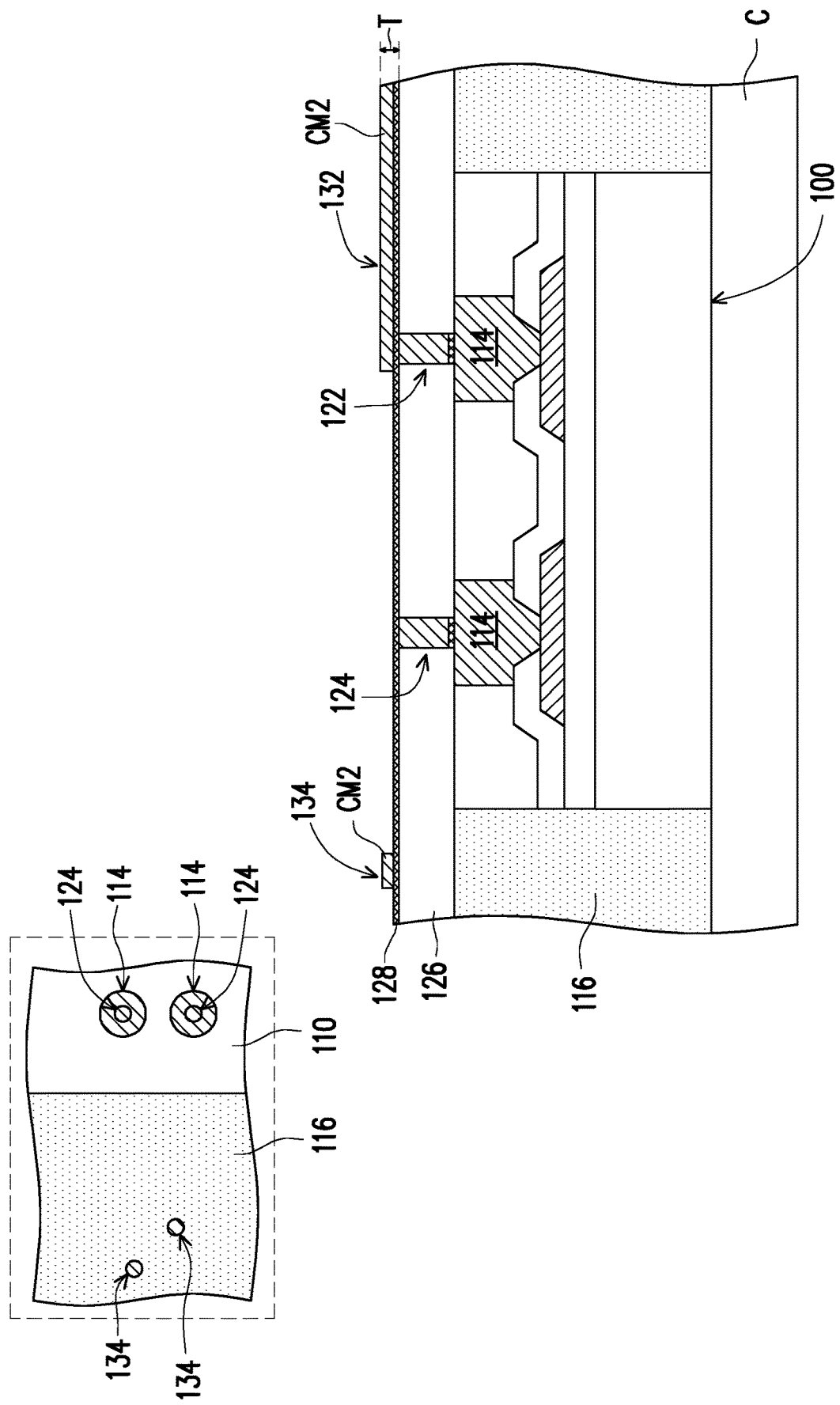

Step S118 is performed, and a second photoresist pattern 130 is formed over the second seed layer 128. The second photoresist pattern 130 has at least one third opening W3 and at least one fourth opening W4 respectively exposing portions of the second seed layer 128. The third opening W3 and the fourth opening W4 respectively define locations and shapes of the conductive trace 132 and the spacer 134 formed in the following steps (as shown in FIG. 2I). Although the second photoresist pattern 130 is depicted as having two openings, those skilled in the art may form three or more openings in the second photoresist pattern 130 according to design requirement, the present disclosure is not limited thereto.

Referring to FIG. 1, FIG. 2H and FIG. 2I, step S120 is performed, and the third and fourth openings W3 and W4 are filled with a second conductive material CM2. A portion of the second conductive material CM2 located in the third opening W3 as well as an underlying portion of the second seed layer 128 are collectively referred as a conductive trace 132, whereas a portion of the second conductive material CM2 located in the fourth opening W4 as well as an underlying portion of the second seed layer 128 are collectively referred as a spacer 134. Since the spacer 134 is constituted of conductive materials, the spacer 134 is also referred as a conductive spacer. In some embodiments, the conductive material CM2 may not be fully filled up to the full height of the openings (i.e., the third and fourth openings W3 and W4). In these embodiments, top surfaces of the conductive trace 132 and the spacer 134 are lower than a top surface of the second photoresist pattern 130. Since the spacer 134 and the conductive trace 132 are simultaneously formed, a thickness of the conductive trace 132 may be substantially equal to a thickness of the spacer 134, and is referred as a thickness T. For instance, the thickness T of the conductive trace 132 and the spacer 134 may range from 0.3 μm to 2 μm. The location of the conductive trace 132 is overlapped with that of the conductive plug 122, and the conductive trace 132 is connected with the conductive plug 122. In some embodiments, the conductive trace 132 may be functioned as a die interconnection structure or an element of a redistribution layer (RDL). In some embodiments, the conductive trace 132 may extend from the conductive plug 122 to the molding compound 116, and function as a fan-out trace. As such, the conductive trace 132 may be located above the semiconductor die 100 and the molding compound 116. On the other hand, in some embodiments, the spacer 134 is located above the molding compound 116, and located outside the span of the semiconductor die 100. The area enclosed by a dash line in FIG. 2G shows an exemplary top view illustrating two of the spacers 134, two of the inductor plugs 124 and the conductive pillars 114 lying under the inductor plugs 124, while the seed layers and the polymer layer are omitted for clarification. Referring to the top view in FIG. 2I, the spacers 134 are located within the span of the molding compound 116, whereas the inductor plugs 124 are located within the span of the semiconductor die 100. It should be noted that, dimensions (except for the thickness) of the conductive trace 132 and the spacer 134 are determined by the dimensions of the third and fourth openings W3 and W4 of the second photoresist pattern 130, which are defined by a lithography process. In other words, an etching process may not be required for forming the conductive trace 132 and the spacer 134. As a merit of great resolution capability of the lithography process, conductive trace 132 and the spacer 134 can have a rather small dimension (e.g., a rather small length, width or spacing). Accordingly, the conductive trace 132 in the semiconductor package of the present disclosure can have a greater routing density. In some embodiments, a top view shape of the spacer 134 is substantially circular, but the present disclosure is not limited to the top view shape of the spacer 134. In some embodiments, the second conductive material CM2 may be formed by a plating process or a deposition process. The second conductive material CM2 used for forming the conductive trace 132 and the spacer 134 may respectively include Al, Cu, Ni, Ti, the like or combinations thereof.

Referring to FIG. 2H and FIG. 2I, after forming the conductive trace 132 and the spacer 134, the second photoresist pattern 130 may be removed, and the underlying seed layer 128 is exposed. For example, the second photoresist pattern 130 may be removed an ashing process or a stripping process.

Figure 2J:
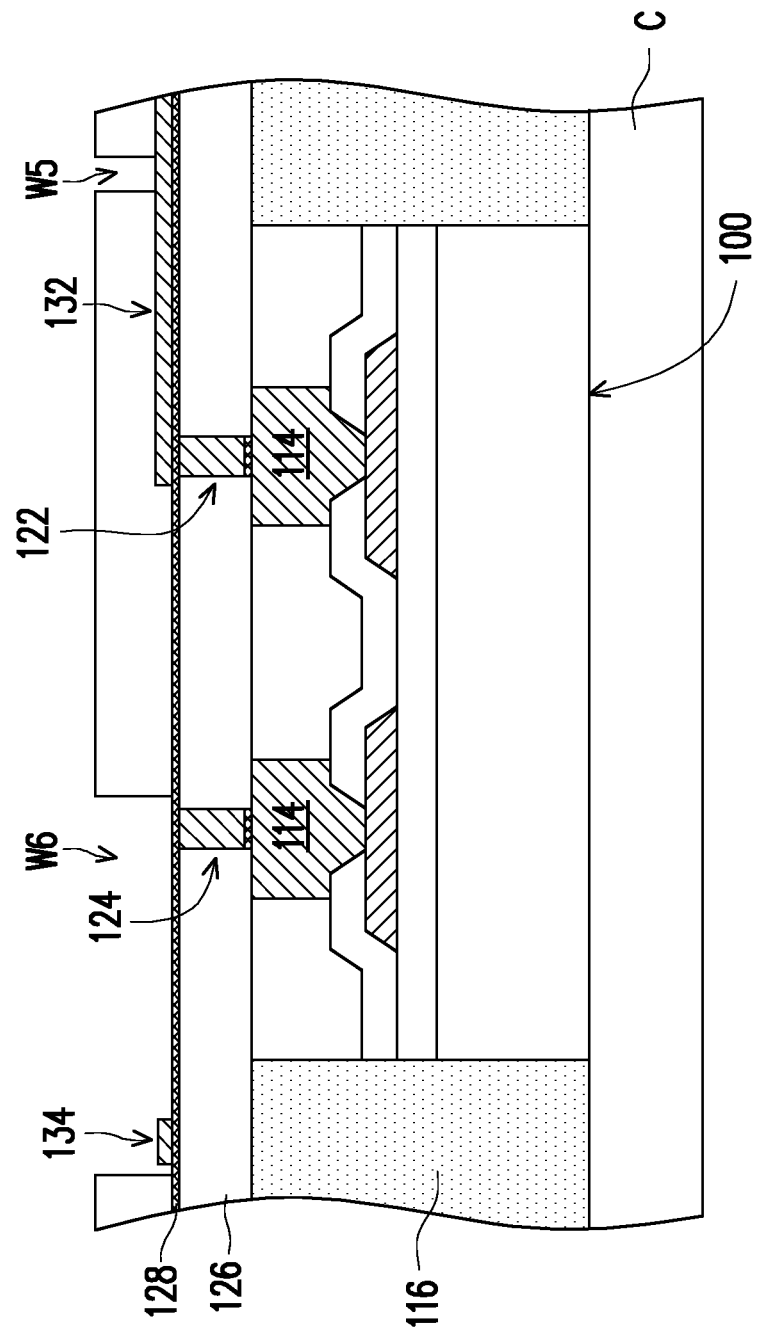
Figure 2K:
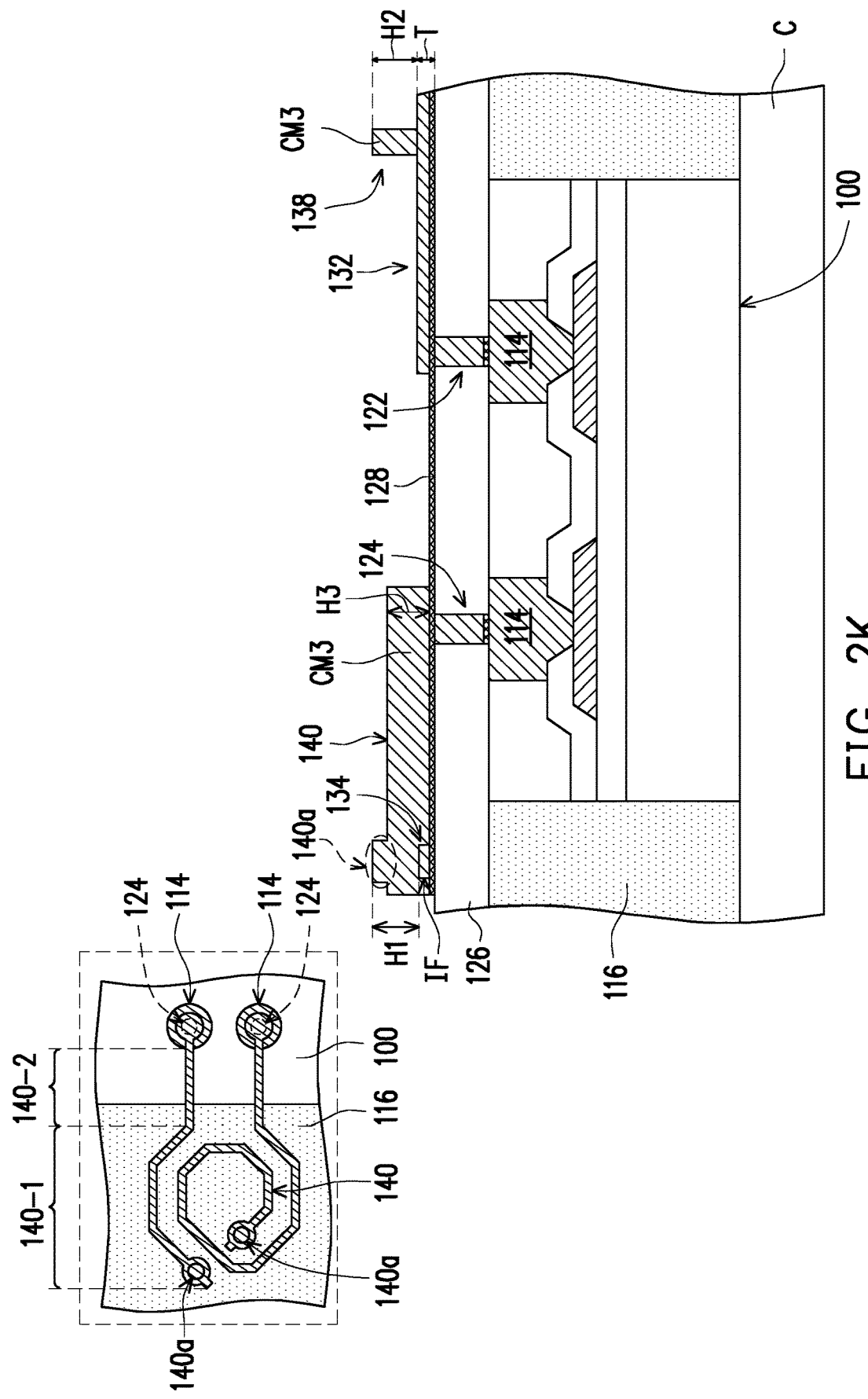

Referring to FIG. 1 and FIG. 2J, step S122 is performed, and a third photoresist pattern 136 is formed over the polymer layer 126. The third photoresist pattern 136 has at least one fifth opening W5 and at least one sixth opening W6. A portion of the conductive trace 132 is exposed by the fifth opening W5, whereas a portion of the second seed layer 128 and the spacer 134 are exposed by the sixth opening W6. The fifth opening W5 and the sixth opening W6 respectively define locations and shapes of the conductive via 138 and the inductor line 140 formed in the following steps (as shown in FIG. 2K). Although the third photoresist pattern 136 is depicted as having two openings, those skilled in the art may form three or more openings in the third photoresist pattern 136 according to design requirement, the present disclosure is not limited thereto.

Referring to FIG. 1, FIG. 2J and FIG. 2K, step S124 is performed, and the fifth and sixth openings W5 and W6 are filled by a third conductive material CM3. A portion of the third conductive material CM3 in the fifth opening W5 is referred as a conductive via 138. The conductive via 138 is located over the conductive trace 132, and electrically connected with the conductive trace 132. In addition, a portion of the third conductive material CM3 in the sixth opening W6 and an underlying portion of the second seed layer 128 are collectively referred as an inductor line 140. The inductor line 140 overlaps and electrically connects with the inductor plug 124. In some embodiments, the inductor line 140 is conformally formed on the second seed layer 128 within the sixth opening W6. As such, the spacer 134 is covered by the inductor line 140, and the inductor line 140 has a bulge 140a corresponded to the underlying spacer 134. In some embodiments, a thickness of the bulge 140a is substantially equal to the thickness T of the spacer 134. In addition, since the portions of the third conductive material CM3 respectively included in the inductor line 140 and the conductive via 138 are formed at the same time, these portions of the third conductive material CM3 may have substantially the same thickness. In other words, a height H1 of the inductor line 140 measured from a top surface of the spacer 134 to a top surface of the bulge 140a is substantially equal to a height H2 of the conductive via 138. In some embodiment, a height H3 measured from a top surface of the second seed layer 128 to a top surface of a flat portion of the inductor line 140 is substantially equal to the height H2 of the conductive via 138 as well. Furthermore, the thickness of the portions of the third conductive material CM3 included in the conductive line 140 and the conductive via 138 is much greater than the thickness T of the conductive trace 132 and the spacer 134. As such, the height H1 and the height H2 are respectively greater than the thickness T. Accordingly, the inductor line 140 can have a rather large thickness, whereas the conductive trace 132 has a rather small thickness. As compared to those inductor line and the conductive trace formed to have the same thickness, the inductor line 140 can have a greater thickness than the conductive trace 132 of the present disclosure. Therefore, a quality factor of the inductor line 140 and a routing density of the conductive trace 132 of the present disclosure can be both improved. In some embodiments, a ratio of the height H1 (or the height H2) with respect to the thickness T ranges from 1 to 5. For instance, the thickness T may range from 0.3 μm to 2 μm, whereas the height H1 (or the height H2) may range from 2 μm to 10 μm. In some embodiments, the third conductive material CM3 may be formed by a plating process. The third conductive material CM3 used for forming the conductive via 138 and the inductor line 140 may respectively include Al, Cu, Ni, Ti, the like or combinations thereof.

In certain embodiments, when the second conductive material CM2 for forming the spacer 134 and the third conductive material CM3 for forming the inductor line 140 may be the same and there is no interface or a vague interface between the spacer 134 and the inductor line 140. In other embodiments, when the second conductive material CM2 for forming the spacer 134 and the third conductive material CM3 for forming the inductor line 140 are different materials or are similar materials but formed by different methods, an interface IF may exist between the spacer 134 and the inductor line 140.

The area enclosed by a dash line in FIG. 2K shows an exemplary top view of two of the inductor lines 140, two of the inductor plugs 124 and the conductive pillars 114 lying under the inductor plugs 124, while the seed layers and the polymer layer are omitted for clarification. Referring to the top view in FIG. 2K, in some embodiments, the inductor line 140 may have a coil part 140-1 and a connecting part 140-2. The coil part 140-1 is located over the molding compound 116 and outside the span of the semiconductor die 100, so as to avoid from an interference between the semiconductor die 100 and the coil part 140-1 of the inductor lines 140. In addition, the coil part 140-1 may extend spirally along a direction parallel with a top surface of the polymer layer 126. On the other hand, the connecting part 140-2 is located over and within the span of the semiconductor die 100, and may extend to above the molding compound 116, so as to be connected between the inductor plug 124 and the coil part 140-1. However, those skilled in the art may modify the top view shapes of the inductor lines 140, the present disclosure is not limited thereto.

Referring to FIG. 2J and FIG. 2K, after forming the conductive via 138 and the inductor line 140, the third photoresist pattern 136 is removed, and the underlying seed layer 128 is exposed. In some embodiments, the third photoresist pattern 136 is removed by, for example, an ashing process or a stripping process.

Figure 2L:
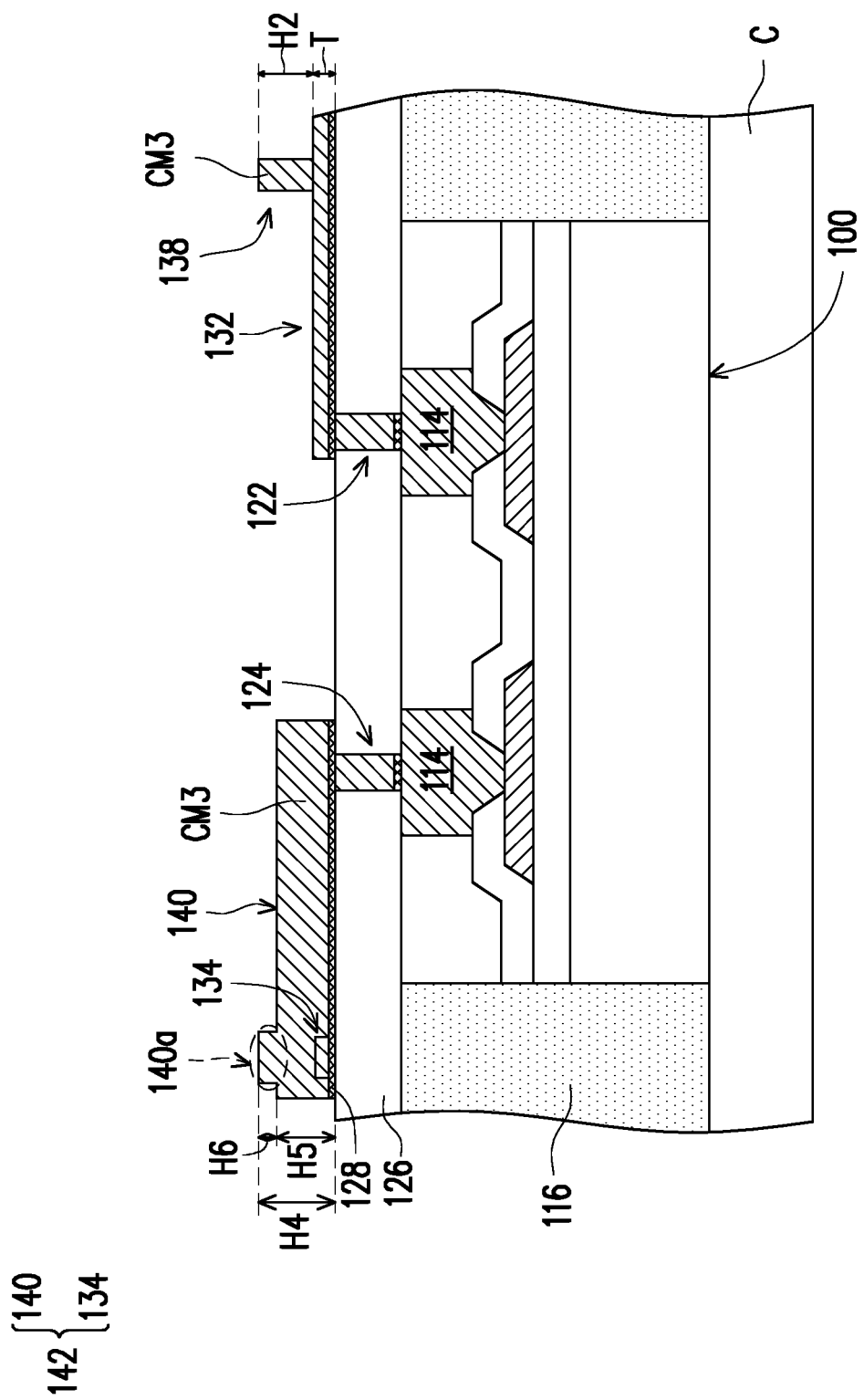

Referring to FIG. 1, FIG. 2K and FIG. 2L, step S126 is performed, and the exposed portions of the second seed layer 128 are removed. As such, the portions of the second seed layer 128 lying under the inductor line 140 and the conductive trace 132 are remained, while other portions of the second seed layer 128 are removed. Accordingly, the inductor line 140 can be electrically separated from the conductive trace 132. In some embodiments, the exposed portions of the second seed layer 128 may be removed by an etching process, such as an anisotropic etching process or an isotropic etching process.

Referring to FIG. 2L, the spacer 134 and the inductor line 140 may be collectively referred as an inductor 142. The inductor 142 has a body portion extending along a horizontal direction substantially parallel with the top surface of the polymer layer 126. The body portion of the inductor 142 includes the spacer 134 and a portion of the inductor line 140 that is extending horizontally. In addition, the inductor 142 further has a protruding portion (i.e., the bulge 140a of the inductor line 140) that is protruding from a top surface of the body portion along a vertical direction substantially normal to the top surface of the polymer layer 126. A total height H4 of the inductor 142 is a sum of a height H5 of the body portion and a height H6 of the protruding portion, and is substantially equal to a sum of the thickness T of the conductive trace 132 and the height H2 of the conductive via 138. The height H5 of the body portion of the inductor 142 is greater than the thickness T of the conductive trace 132, and may be close to the height H2 of the conductive via 138. In some embodiments, the height H5 of the body portion of the inductor 142 is greater than the height H2 of the conductive via 138 by a thickness of the second seed layer 128. On the other hand, the height H6 of the protruding portion of the inductor 142 is close to the thickness of the spacer 134 (i.e., the thickness T of the conductive trace 132). In some embodiments, the height H6 of the protruding portion of the inductor 142 is less than the thickness of the spacer 134 (i.e., the thickness T of the conductive trace 132) by the thickness of the second seed layer 128.

Figure 2M:
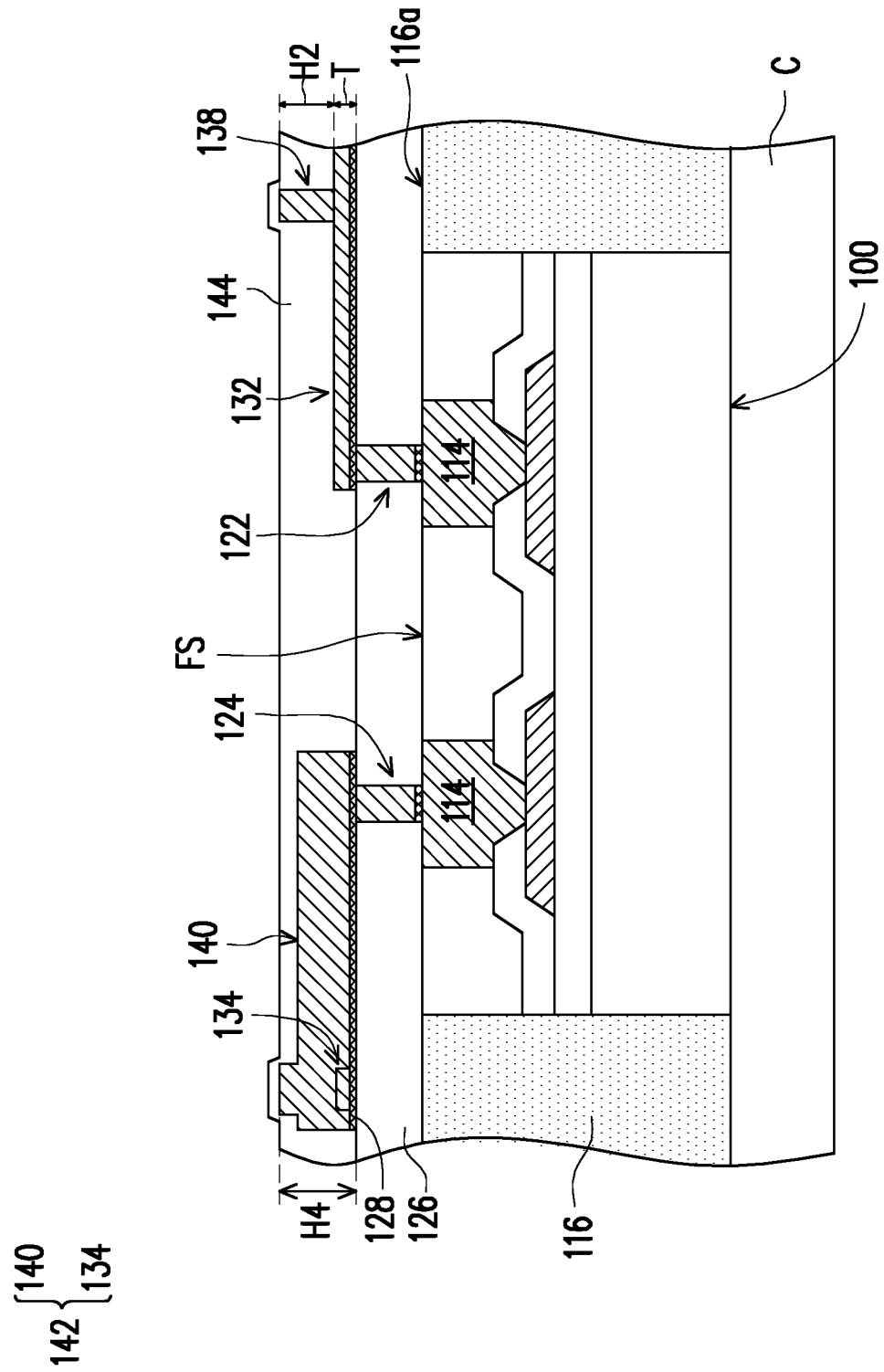
Figure 2N:
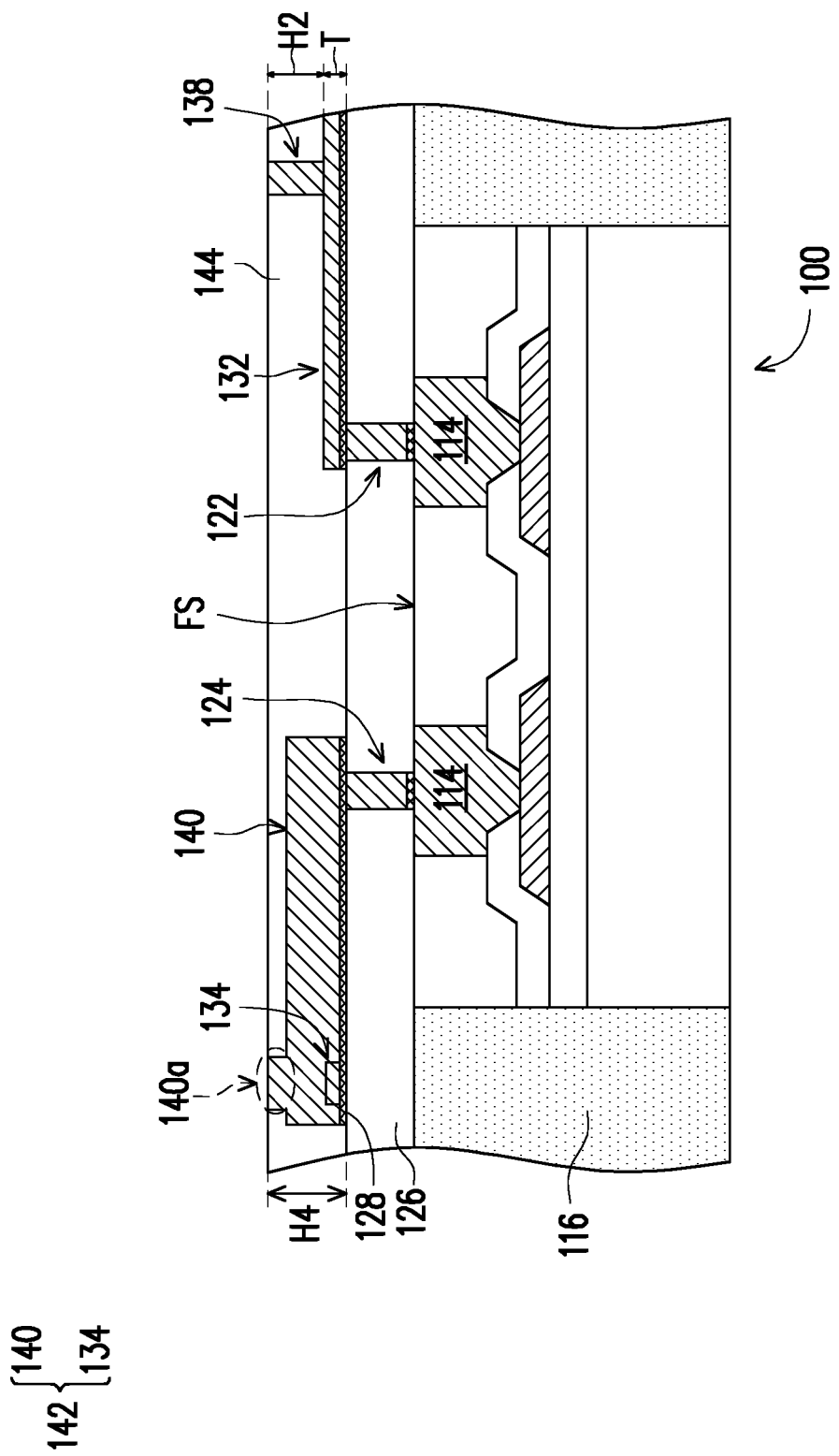

Referring to FIG. 1 and FIG. 2M, step S128 is performed, and a polymer layer 144 is formed over the front surface FS of the semiconductor die 100 and the top surface 116a of the molding compound 116. Substantially the whole top surface of the wafer structure shown in FIG. 2L is conformally covered by the polymer layer 144. As such, the conductive trace 132, the conductive via 138, the spacer 134 and the inductor line 140 are covered by the polymer layer 144, and can be regarded as being embedded in the polymer layer 144. A material of the polymer layer 144 may include polyimide, polybenzoxazole, benzocyclobuten, silicones, acrylates, epoxy or combinations thereof. In addition, the polymer layer 144 may be formed by a solution process, such as a spin coating process.

Referring to FIG. 1 and FIG. 2N, step S130 is performed, and a planarization process is performed to the polymer layer 144. As such, top surfaces of the conductive via 138 and the inductor line 140 (i.e., a top surface of the bulge 140a) are exposed. In some embodiments, the top surface of the conductive via 138 is substantially coplanar with the top surface of the bulge 140a and a top surface of the planarized polymer layer 144. In addition, the conductive via 138 can be regarded as extending from a top surface of the conductive trace 132 to the top surface of the polymer layer 144. In some embodiments, the planarization process may include a chemical mechanical polishing (CMP) process, a grinding process or an etching back process.

Furthermore, in some embodiments, additional interconnection structures and/or electrical connectors (not shown) may be formed on the polymer layer 144 and the conductive via 138, and the semiconductor die 100 can be further out routed by these additional interconnection structures and/or electrical connectors. Moreover, additional inductor line(s) and/or via(s) may be formed on the polymer layer 144 and the bulge 140a of the inductor line 140, so as to form a multilayer inductor. In addition, the carrier C may be removed from the present wafer structure, and a singulation process may be performed to the present wafer structure.

Up to here, a semiconductor package 10 according to some embodiments of the present disclosure is formed. The inductor 142, the conductive trace 132 and the conductive via 138 are formed in the polymer layer 144, which is located over the semiconductor die 100 and the molding compound 116. A thickness of the inductor 142 (i.e., the height H4) is substantially equal to a total thickness of the conductive trace 132 and the conductive via 138 (i.e., the sum of the thickness T and the height H2). In other words, the thickness of the inductor 142 (i.e., the height H4) is greater than the thickness T of the conductive trace 132. In some embodiments, the thickness of the inductor 142 (i.e., the height H4) of the inductor 142 is much greater than the thickness T of the conductive trace 132, and is close to the height H2 of the conductive via 138. Since the thick inductor 142 and the fine conductive trace 132 are both formed in the semiconductor package 10, improved routing density of the conductive trace 132 can be achieved without compromising quality factor of the inductor 142. In some embodiments, the inductor 142 includes the spacer 134 and the inductor line 140. The spacer 134 is covered by the inductor line 140. As such, the inductor line 140 has the bulge 140a corresponded to the underlying spacer 134. A top surface of the bulge 140a is substantially coplanar with a top surface of the polymer 144, whereas other portions of the inductor line 140 are buried in the polymer 144. As such, when additional inductor (if any) is formed over the polymer layer 144, the inductor line 140 may contact the additional inductor through the bulge 140a, rather than in fully contact with the additional inductor. Furthermore, the spacer 134 and the conductive trace 132 may be formed during the same photomask process, whereas the inductor line 140 and the conductive via 138 may be formed during the same photomask process. Therefore, an additional photomask process may not be required to form the rather thick inductor 142.

Figure 3:
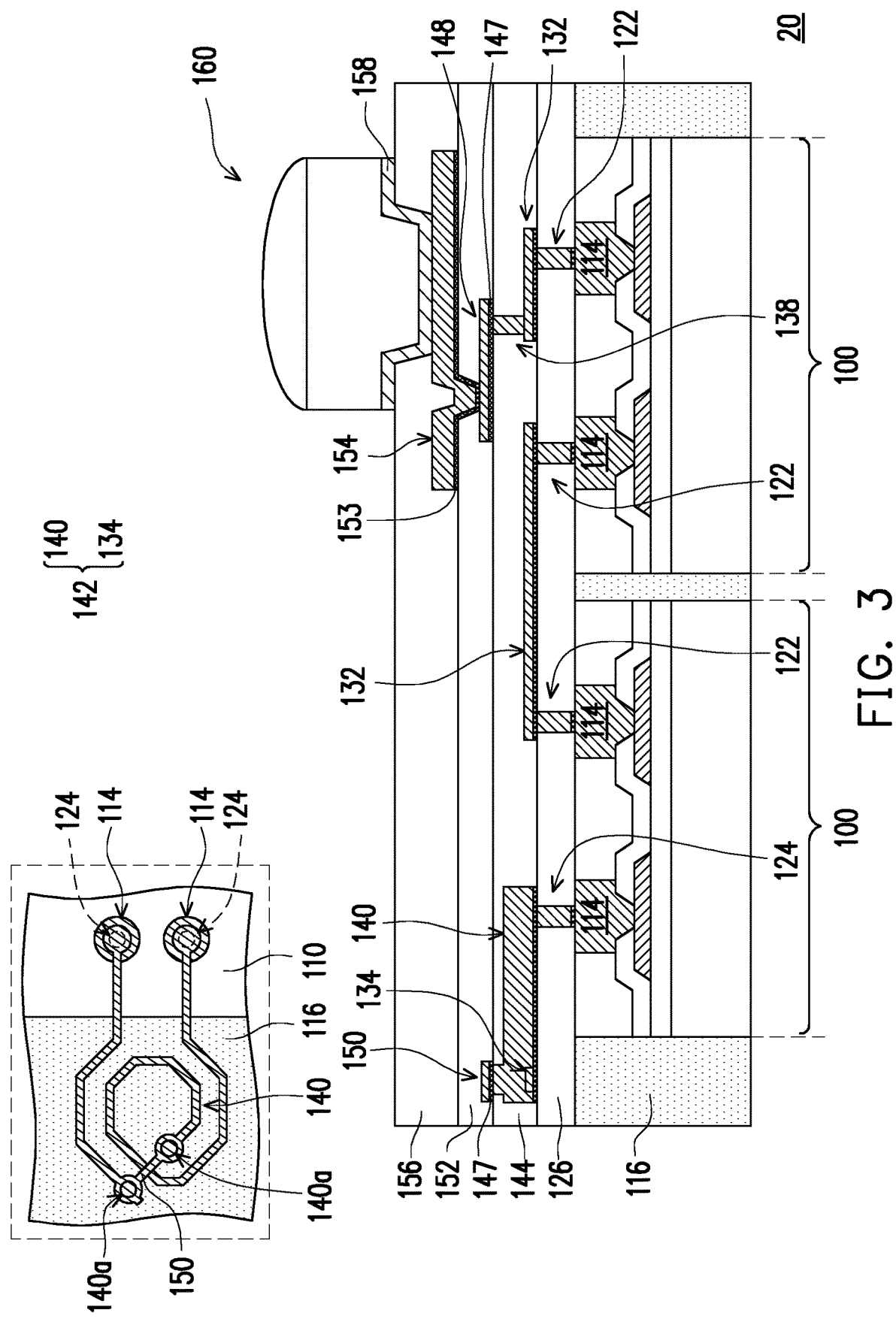
FIG. 3 and FIG. 4 are schematic cross-sectional views respectively illustrating semiconductor packages according to some embodiments of the present disclosure.

FIG. 3 is a schematic cross-sectional view illustrating a semiconductor package 20 according to some embodiments of the present disclosure. The semiconductor package 20 is similar with the semiconductor package 10 as shown in FIG. 2N, only the difference therebetween will be described, the same or the like will be omitted. In addition, the same or the like reference labels represents the same or the like elements.

Referring to FIG. 3, multiple semiconductor dies 100 are encapsulated by the molding compound 116, and respectively out routed through at least one conductive plug 122 formed in the polymer layer 126. In addition, at least one of the semiconductor dies 100 are electrically connected with the inductor plug 124 formed in the polymer layer 126. Multiple conductive traces 132 are formed in the polymer layer 144 lying over the polymer layer 126. At least one of the conductive traces 132 is electrically connected between adjacent semiconductor dies 100 through some of the conductive plugs 122, and may be functioned as a die-to-die interconnection. In some embodiments, the conductive via(s) 138 may be formed over at least one of the conductive traces 132. During the formation of the conductive traces 132 and the conductive via(s) 138, the inductor 142 including the spacer 134 and the inductor line 140 is formed in the polymer layer 144. The inductor 142 is electrically connected with the inductor plug 124.

In some embodiments, a conductive trace 148 and an inductor interconnection structure 150 may be formed over the polymer layer 144 by a method similar to the formation of the conductive trace 132 and the spacer 134 described with reference to FIG. 2H and FIG. 2I. As such, the conductive trace 148 and the inductor interconnection structure 150 may respectively include a line section of a seed layer (e.g., the seed layer 147) at bottom portions of the conductive trace 148 and the inductor interconnection structure 150. The conductive trace 148 is electrically connected with the underlying conductive via 138, whereas the inductor interconnection structure 150 is electrically connected with the underlying inductor line 140. Thereafter, a polymer layer 152 may be formed over the polymer layer 144. The conductive trace 148 and the inductor interconnection structure 150 may be covered by the polymer layer 152. In some embodiments, a material of the polymer layer 152 may include polyimide, polybenzoxazole, benzocyclobuten, silicones, acrylates, epoxy or combinations thereof. The area enclosed by a dash line in FIG. 3 shows an exemplary top view illustrating the inductor interconnection structure 150, the inductor lines 140, the inductor plugs 124 and the underlying conductive pillars 114. Referring to the top view in FIG. 3, the inductor interconnection structure 150 is connected between the bulges 140a of the inductor lines 140. As such, the spacer 150 may be functioned as a bridge connecting between adjacent inductor lines 140.

Furthermore, referring to the cross-sectional view in FIG. 3, an interconnection structure 154 may be formed over the polymer layer 152, and extends into the polymer layer 152 to be electrically connected with the conductive trace 148. In some embodiments, the interconnection structure 154 may be formed by a plating process. As such, the interconnection structure 154 may include a seed layer (e.g., a seed layer 153) at a bottom portion of the interconnection structure 154. A material of the interconnection structure 154 may respectively include Al, Cu, Ni, Ti, the like or combinations thereof. In some embodiments, a passivation layer 156 is further formed over the polymer layer 152, and the interconnection structure 154 may be covered by the passivation layer 156. In addition, a conductive pattern 158 may be formed over the passivation layer 156, and extends into the passivation layer 156 to be electrically connected with the underlying interconnection structure 154. In some embodiments, an electrical connector 160 may be formed over the conductive pattern 158, and electrically connected with the conductive pattern 158. A material of the passivation layer 156 may include polyimide, polybenzoxazole, benzocyclobuten, silicones, acrylates, epoxy or combinations thereof, and a formation method of the passivation layer 156 may include a solution process, such as a spin coating process. The conductive pattern 158 may be an under ball metallization (UBM) pattern, and may be made of Cr, Cu, Ti, W, Ni, Al, the like or combinations thereof. In addition, the electrical connector 160 may be a bump, a controlled collapse chip connection (C4) bump or a ball grid array (BGA) ball.

As described above, the semiconductor die 100 may be routed through a RDL including the conductive pillar 114, the conductive trace 132, the conductive via 138, conductive trace 148 and the interconnection structure 154. In addition, signals from the semiconductor die 100 may be output by the electrical connector 160 through the RDL and the conductive pattern 158, or signals may be input to the semiconductor die 100 via the electrical connector 160, the conductive pattern 158 and the RDL. Those skilled in the art may adjust the amount of the elements in the RDL according to design requirements, the present disclosure is not limited thereto. In addition, although the RDL is depicted as having interconnection elements at three horizontal levels, those skilled in the art may adjust the amount of levels in the RDL.

Furthermore, although the conductive trace 132 electrically connecting between the semiconductor dies 100 is depicted as locating at the second horizontal level of the RDL, this conductive trace 132 may actually be disposed at any level in the RDL. Similarly, the inductor 142 may be disposed at other level of the RDL. Correspondingly, the conductive plug 122 and the inductor plug 124 may respectively penetrate more than one polymer layer.

Figure 4:
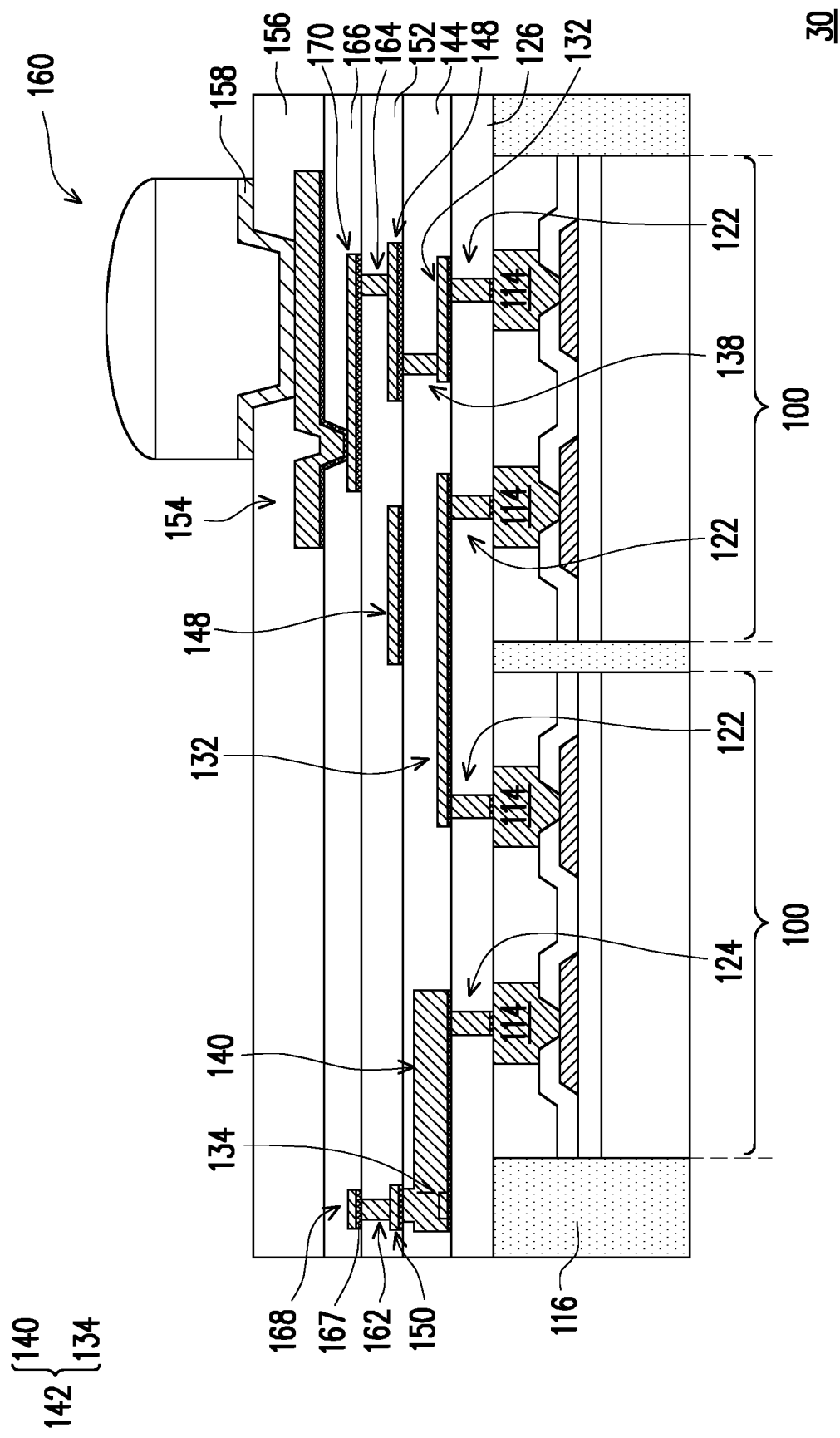

FIG. 4 is a schematic cross-sectional view illustrating a semiconductor package 30 according to some embodiments of the present disclosure. The semiconductor package 30 is similar with the semiconductor package 20 as shown in FIG. 3, only the difference therebetween will be described, the same or the like will be omitted. In addition, the same or the like reference labels represents the same or the like elements.

Referring FIG. 4, the semiconductor package 30 further includes an inductor via 162 and a conductive via 164, which are formed in the polymer layer 152. The inductor via 162 extends from a top surface of the inductor interconnection structure 150 to a top surface of the polymer layer 152, whereas the conductive via 164 extends from a top surface of the conductive trace 148 to the top surface of the polymer layer 152. In some embodiments, the inductor via 162 and the conductive via 164 are formed by a method similar to the formation of the conductive via 138 described with reference to FIG. 2J and FIG. 2K.

Furthermore, a polymer layer 166 is further disposed between the polymer layer 152 and the passivation layer 156. In addition, another inductor line 168 and an interconnection line 170 are disposed in the polymer layer 166. The inductor line 168 is electrically connected with the underlying inductor via 162, whereas the interconnection line 170 is electrically connected with the underlying conductive via 164. In some embodiments, the inductor line 168 and the interconnection line 170 are formed by a method similar to the formation of the conductive trace 132 described with reference to FIG. 2G through FIG. 2I. In addition, a thickness of the inductor line 168 is substantially equivalent to a thickness of the interconnection line 170, and may be substantially the same or different from a thickness of the conductive trace 132. In these embodiments, the inductor line 168 and the interconnection line 170 may respectively include a line section of a seed layer (e.g., a seed layer 167) at bottom portions of the inductor line 168 and the interconnection line 170. In addition, the inductor line 168 may be functioned as an additional bridging structure for connecting different inductor lines 140. Although it is not depicted, the inductor line 168 may alternatively resemble the inductor 142, and has a spacer (similar to the spacer 134) and an overlying inductor line (similar to the inductor line 140) having a bulge corresponding to the underlying spacer. In these alternative embodiments, although it is not depicted, the inductor line 168 may actually extend horizontally, as similar to the inductor line 140 shown in the top view of FIG. 3. As such, the semiconductor package 30 includes a multilayer inductor.

As above, the semiconductor package of the present disclosure includes the inductor, the conductive trace and the conductive via, which are formed in the same polymer layer located over the semiconductor die and the molding compound. A thickness of the inductor is substantially equal to a total thickness of the conductive trace and the conductive via. In other words, the thickness of the inductor is greater than the thickness of the conductive trace. In some embodiments, the thickness of the inductor is much greater than the thickness of the conductive trace, and is close to the thickness of the conductive via. Since the thick inductor and the fine conductive trace are both formed in the semiconductor package, improved routing density of the conductive trace can be achieved without compromising quality factor of the inductor. In some embodiments, the inductor includes the spacer and the inductor line. The spacer is covered by the inductor line. As such, the inductor line has the bulge corresponded to the underlying spacer. A top surface of the bulge is substantially coplanar with a top surface of the polymer, whereas the other portions of the inductor line are buried in the polymer. Thus, when additional inductor (if any) is formed over the polymer layer, the inductor line may contact the additional inductor through the bulge, rather than in fully contact with the additional inductor. Furthermore, the spacer and the conductive trace may be formed in the same photomask process, whereas the inductor line and the conductive via may be formed in the same photomask process. Therefore, an additional photomask process may not be required to form the rather thick inductor.

A semiconductor package according to some embodiments of the present disclosure comprises a semiconductor die, a molding compound, a polymer layer, a conductive trace, a conductive via and an inductor. The semiconductor die is laterally surrounded by the molding compound. An active surface of the semiconductor die and a top surface of the molding compound is covered by the polymer layer. The conductive trace is embedded in the polymer layer. The conductive via extends from a top surface of the conductive trace to a top surface of the polymer layer. The inductor is embedded in the polymer layer, and has a body portion and a protruding portion connected to the body portion. The body portion extends along a horizontal direction substantially parallel to the top surface of the polymer layer. The protruding portion is protruded from the body portion along a vertical direction substantially normal to the top surface of the polymer layer. A total height of the body portion and the protruding portion is substantially equal to a sum of a thickness of the conductive trace and a height of the conductive via. The height of the body portion of the inductor is greater than the thickness of the conductive trace.

A semiconductor package according to other embodiments of the present disclosure comprises first and second semiconductor dies, a molding compound, a polymer layer, a plurality of conductive traces, a conductive via and an inductor. The first and second semiconductor dies are encapsulated by the molding compound. Front surfaces of the first and second semiconductor dies and a top surface of the molding compound are covered by the polymer layer. The plurality of conductive traces are disposed in the polymer. At least one of the plurality of conductive traces is electrically connected between the first and second semiconductor dies. The conductive via extends from a top surface of one of the plurality of conductive traces to a top surface of the polymer layer. The inductor is disposed in the polymer layer, and comprises a spacer and an inductor line. The spacer is located aside the conductive trace. The inductor line extends in the polymer layer, and covers the inductor line. The inductor line has a bulge above the spacer and corresponds to the underlying spacer. A top surface of the bulge is substantially coplanar with the top surface of the polymer layer. A height of the inductor line measured from a top surface of the spacer to the top surface of the bulge is substantially equal to a height of the conductive via.

A manufacturing method of a semiconductor package according to some embodiments of the present disclosure comprises: encapsulating a semiconductor die by a molding compound; forming a conductive trace and a conductive spacer over a front surface of the semiconductor die, wherein a thickness of the conductive trace is substantially equal to a thickness of the spacer; forming a conductive via over the conductive trace and forming an inductor line to cover the conductive spacer, wherein the inductor line has a bulge corresponded to the underlying conductive spacer, and a height of the inductor line measured from a top surface of the conductive spacer to a top surface of the bulge is substantially equal to a height of the conductive via; forming a polymer layer covering the conductive trace, the conductive via, the inductor line and the bulge; and performing a planarization process on the polymer layer to expose the top surface of the bulge of the inductor line and a top surface of the conductive via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a semiconductor die laterally surrounded by a molding compound;
   a polymer layer, covering an active surface of the semiconductor die and a top surface of the molding compound;
   a conductive trace, embedded in the polymer layer;
   a conductive via, extending from a top surface of the conductive trace to a top surface of the polymer layer; and
   an inductor, embedded in the polymer layer, and having a body portion and a protruding portion connected to the body portion,
   wherein the body portion extends along a horizontal direction substantially parallel to the top surface of the polymer layer, the protruding portion is protruded from the body portion along a vertical direction substantially normal to the top surface of the polymer layer, a total height of the body portion and the protruding portion is substantially equal to a sum of a thickness of the conductive trace and a height of the conductive via, and a height of the body portion of the inductor is greater than the thickness of the conductive trace.

2. The semiconductor package of claim 1, further comprising:
   an additional polymer layer, located between the polymer layer and the active surface of the semiconductor die and the top surface of the molding compound;
   a conductive plug, penetrating the additional polymer layer, and electrically connected the semiconductor die and the conductive trace; and
   an inductor plug, penetrating the additional polymer layer, and electrically connected the semiconductor die and the inductor.

3. The semiconductor package of claim 2, further comprising first seed layers respectively located between the semiconductor die and the conductive plug and the inductor plug.

4. The semiconductor package of claim 2, further comprising second seed layers respectively located between the additional polymer layer and the conductive trace and the body portion of the inductor.

5. The semiconductor package of claim 1, wherein the inductor horizontally extends from the semiconductor die to the molding compound.

6. The semiconductor package of claim 5, wherein the protruding portion of the inductor is located outside a span of the semiconductor die, and the body portion of the inductor is overlapped with the molding compound and the semiconductor die.

7. The semiconductor package of claim 6, wherein the body portion of the inductor has a connecting part and a coil part connected with the coil part, the protruding portion is vertically protruded from the coil part, and the connecting part is overlapped with the semiconductor die.

8. The semiconductor package of claim 1, further comprising an inductor interconnection structure, disposed over the polymer layer and electrically connected with the inductor.

9. The semiconductor package of claim 8, further comprising:
   an additional polymer layer, disposed over the polymer layer, wherein the inductor interconnection structure is disposed in the additional polymer layer; and
   an inductor via, disposed in the additional polymer layer, and extending from a top surface of the inductor interconnection structure to a top surface of the additional polymer layer.

10. The semiconductor package of claim 9, further comprising an additional inductor line, disposed over the additional polymer layer, and electrically connected to the inductor via.

11. The semiconductor package of claim 1, wherein a height of the body portion is greater than the height of the conductive via.

12. A semiconductor package, comprising:
   a semiconductor die;
   a molding compound, encapsulating the semiconductor die;
   a conductive trace, lying over the semiconductor die as well as the molding compound, and electrically connected to the semiconductor die;
   a conductive via, standing on the conductive trace; and
   an inductor, disposed aside the conductive trace and the conductive via, and electrically connected to the semiconductor die,
   wherein the inductor has a body portion and a protruding portion connected to the body portion, the body portion extends along a horizontal direction, the protruding portion protrudes from the body portion along a vertical direction, a total height of the body portion and the protruding portion is substantially equal to a sum of a thickness of the conductive trace and a height of the conductive via, and a height of the body portion of the inductor is greater than the thickness of the conductive trace.

13. The semiconductor package of claim 12, wherein a top surface of the protruding portion of the inductor is substantially coplanar with a top surface of the conductive via.

14. The semiconductor package of claim 12, wherein a bottom surface of the body portion of the inductor is substantially leveled with a bottom surface of the conductive trace.

15. The semiconductor package of claim 12, wherein the inductor comprises a seed layer and a conductive material formed on the seed layer.

16. The semiconductor package of claim 15, wherein the seed layer lies in a bottommost region of the body portion, and the conductive material spans from a top surface of the seed layer to a top surface of the inductor.

17. The semiconductor package of claim 16, wherein a first height measured from the top surface of the seed layer to a top surface of the body portion of the inductor is substantially equal with the height of the conductive via.

18. The semiconductor package of claim 16, wherein a second height measured from the top surface of the seed layer to a top surface of the protruding portion of the inductor is greater than the height of the conductive via.

19. The semiconductor package of claim 12, wherein the conductive trace comprises a seed layer and a conductive material formed on the seed layer.

20. A semiconductor package, comprising:
a semiconductor die;
a molding compound, laterally encapsulating the semiconductor die;
polymer layers, stacked on the semiconductor die and the molding compound; and
a routing structure and an inductor line, separately disposed in one of the polymer layers and electrically connected to the semiconductor die, wherein the routing structure comprises a conductive trace and a conductive via standing on the conductive trace, the inductor line has a line portion and a protruding portion protruded upwardly from the line portion, a total height of the protruding portion and the line portion of the inductor line is substantially equal to a sum of a thickness of the conductive trace and a height of the conductive via, and a height of the line portion of the inductor is greater than the thickness of the conductive trace.

* * * * *